US012366622B2

(12) United States Patent
Boskamp et al.

(10) Patent No.: US 12,366,622 B2
(45) Date of Patent: Jul. 22, 2025

(54) RADIO FREQUENCY COIL FOR MAGNETIC RESONANCE IMAGING

(71) Applicant: Hyperfine Operations, Inc., Guilford, CT (US)

(72) Inventors: Eddy B. Boskamp, Shelton, CT (US); Michael Stephen Poole, Guilford, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 170 days.

(21) Appl. No.: 18/353,029

(22) Filed: Jul. 14, 2023

(65) Prior Publication Data
US 2023/0358832 A1 Nov. 9, 2023

Related U.S. Application Data

(63) Continuation of application No. PCT/US2022/012486, filed on Jan. 14, 2022.
(Continued)

(51) Int. Cl.
*G01R 33/44* (2006.01)
*G01R 33/34* (2006.01)
(Continued)

(52) U.S. Cl.
CPC ..... *G01R 33/445* (2013.01); *G01R 33/34007* (2013.01); *G01R 33/3628* (2013.01); *G01R 33/385* (2013.01)

(58) Field of Classification Search
CPC ............ G01R 33/445; G01R 33/34007; G01R 33/3628; G01R 33/385; G01R 33/34046; A61B 5/055
See application file for complete search history.

(56) References Cited

U.S. PATENT DOCUMENTS

| 4,766,378 A | 8/1988 | Danby et al. |
| 5,057,777 A | 10/1991 | Kurczewski |

(Continued)

FOREIGN PATENT DOCUMENTS

| CN | 103645451 A | 3/2014 |
| CN | 103744041 B | 4/2014 |

(Continued)

OTHER PUBLICATIONS

Extended European Search Report for EP App. No. 22740132.0 dated Nov. 4, 2024 (9 pages).
(Continued)

*Primary Examiner* — G. M. A Hyder
(74) *Attorney, Agent, or Firm* — Foley & Lardner LLP

(57) ABSTRACT

A radio frequency (RF) coil apparatus is described herein for facilitating imaging of a patient positioned within a magnetic resonance imaging (MRI) system, the MRI system comprising a $B_0$ magnet. The apparatus may comprise a frame comprising a first plate and a second plate disposed opposite the first plate; and an RF transmit coil comprising a plurality of conductors connected in series, the plurality of conductors being would around the frame and forming a plurality of turns. According to some aspects, there is provided an MRI system configured to image a patient positioned within the MRI system, the MRI system comprises a $B_0$ magnet that produces a $B_0$ magnetic field and the RF coil apparatus.

20 Claims, 13 Drawing Sheets

Related U.S. Application Data

(60) Provisional application No. 63/137,930, filed on Jan. 15, 2021.

(51) Int. Cl.
 *G01R 33/36* (2006.01)
 *G01R 33/385* (2006.01)

(56) References Cited

U.S. PATENT DOCUMENTS

| | | |
|---|---|---|
| 5,483,159 A | 1/1996 | Van Heelsbergen |
| 5,600,245 A | 2/1997 | Yamamoto et al. |
| 6,060,882 A | 5/2000 | Doty |
| 6,420,871 B1 | 7/2002 | Wong et al. |
| 6,700,376 B2 | 3/2004 | Goto et al. |
| 6,707,301 B2 | 3/2004 | Goto |
| 6,744,252 B2 | 6/2004 | Goto |
| 7,463,031 B2 | 12/2008 | Kato |
| 7,663,367 B2 | 2/2010 | Wiggins |
| 7,804,300 B2 | 9/2010 | Possanzini |
| 7,834,630 B2 | 11/2010 | Damadian et al. |
| 8,704,520 B2 | 4/2014 | Saha et al. |
| 8,816,687 B2 | 8/2014 | Takamori |
| 9,545,218 B2 | 1/2017 | Ota et al. |
| 9,696,393 B2 | 7/2017 | Arias et al. |
| 10,527,689 B2 | 1/2020 | Rosen et al. |
| 10,627,464 B2 | 4/2020 | Dyvorne et al. |
| 10,794,974 B2 | 10/2020 | Hugon et al. |
| 10,827,948 B1 | 11/2020 | Tramm et al. |
| 10,912,517 B2 | 2/2021 | Poole et al. |
| 11,039,787 B2 | 6/2021 | Jones |
| 11,143,723 B2 | 10/2021 | Brown |
| 2002/0079996 A1 | 6/2002 | Zhang et al. |
| 2002/0145428 A1 | 10/2002 | Nistler et al. |
| 2002/0180439 A1 | 12/2002 | Lee |
| 2003/0122546 A1 | 7/2003 | Leussler |
| 2005/0062472 A1 | 3/2005 | Bottomley |
| 2005/0248347 A1 | 11/2005 | Damadian |
| 2005/0253582 A1 | 11/2005 | Giaquinto et al. |
| 2006/0055406 A1 | 3/2006 | Lvovsky et al. |
| 2006/0132134 A1 | 6/2006 | Amm et al. |
| 2006/0267586 A1 | 11/2006 | Okamoto et al. |
| 2007/0159170 A1 | 7/2007 | Freytag et al. |
| 2008/0007250 A1 | 1/2008 | Wiggins |
| 2008/0204021 A1 | 8/2008 | Leussler et al. |
| 2008/0238424 A1 | 10/2008 | Possanzini |
| 2008/0284435 A1 | 11/2008 | Overweg et al. |
| 2009/0121715 A1 | 5/2009 | Guan et al. |
| 2009/0261828 A1 | 10/2009 | Nordmeyer-Massner et al. |
| 2010/0013418 A1 | 1/2010 | Kruip et al. |
| 2010/0305427 A1 | 12/2010 | Huber et al. |
| 2010/0315085 A1 | 12/2010 | Brown et al. |
| 2011/0026801 A1 | 2/2011 | Dohata et al. |
| 2011/0031970 A1 | 2/2011 | Ninomiya et al. |
| 2011/0121830 A1 | 5/2011 | Ma et al. |
| 2011/0273177 A1 | 11/2011 | McGinley et al. |
| 2012/0161767 A1 | 6/2012 | Hardy et al. |
| 2012/0161768 A1 | 6/2012 | Hardy et al. |
| 2012/0286921 A1 | 11/2012 | Wang et al. |
| 2013/0093425 A1 | 4/2013 | Chu et al. |
| 2013/0137969 A1 | 5/2013 | Jones |
| 2013/0320981 A1 | 12/2013 | Bulumulla et al. |
| 2013/0320982 A1 | 12/2013 | Bulumulla et al. |
| 2014/0091791 A1 | 4/2014 | Bulumulla et al. |
| 2014/0210466 A1 | 7/2014 | Arias et al. |
| 2014/0218033 A1 | 8/2014 | Ryu et al. |
| 2014/0263017 A1 | 9/2014 | Jones et al. |
| 2015/0005618 A1 | 1/2015 | Dumoulin |
| 2015/0008923 A1 | 1/2015 | Ando |
| 2015/0226817 A1 | 8/2015 | Pourrahimi |
| 2015/0323628 A1 | 11/2015 | Wald et al. |
| 2015/0355297 A1 | 12/2015 | Menon et al. |
| 2017/0074956 A1 | 3/2017 | Rosen et al. |
| 2017/0219666 A1* | 8/2017 | Kim ............... G01R 33/34046 |
| 2017/0343625 A1 | 11/2017 | Chu et al. |
| 2018/0070852 A1 | 3/2018 | Azulay et al. |
| 2018/0136293 A1 | 5/2018 | Xie et al. |
| 2018/0149718 A1 | 5/2018 | Guo et al. |
| 2018/0263561 A1 | 9/2018 | Jones |
| 2019/0154775 A1 | 5/2019 | Stack et al. |
| 2019/0219648 A1 | 7/2019 | Lin et al. |
| 2019/0277926 A1 | 9/2019 | Stormont et al. |
| 2019/0293738 A1 | 9/2019 | Popescu |
| 2019/0310329 A1 | 10/2019 | Malik et al. |
| 2019/0310330 A1 | 10/2019 | Yang et al. |
| 2019/0353722 A1 | 11/2019 | Stormont et al. |
| 2019/0353726 A1 | 11/2019 | Poole et al. |
| 2020/0022613 A1 | 1/2020 | Nelson et al. |
| 2020/0081082 A1 | 3/2020 | Kundner et al. |
| 2020/0093394 A1 | 3/2020 | Li et al. |
| 2020/0158800 A1 | 5/2020 | Taracila et al. |
| 2020/0271738 A1 | 8/2020 | Qin et al. |
| 2020/0309876 A1 | 10/2020 | Robb et al. |
| 2020/0355761 A1 | 11/2020 | McNulty et al. |
| 2020/0408860 A1 | 12/2020 | Taracila et al. |
| 2021/0173027 A1 | 6/2021 | Hugon et al. |
| 2021/0293915 A1 | 9/2021 | Fenchel et al. |
| 2021/0356541 A1 | 11/2021 | Guan et al. |
| 2021/0369133 A1 | 12/2021 | Coppens et al. |
| 2022/0229132 A1 | 7/2022 | Chen et al. |
| 2022/0354378 A1 | 11/2022 | Nacev et al. |
| 2024/0168105 A1 | 5/2024 | Inglis et al. |

FOREIGN PATENT DOCUMENTS

| | | |
|---|---|---|
| CN | 106291422 A | 1/2017 |
| CN | 207051471 U | 2/2018 |
| CN | 208864328 U | 5/2019 |
| CN | 212207645 U | 12/2020 |
| JP | 1119061 A | 1/1999 |
| WO | WO-2023/049506 A1 | 3/2023 |

OTHER PUBLICATIONS

Extended European Search Report for EP App. No. 22740137.9 dated Nov. 7, 2024 (10 pages).
International Search Report and Written Opinion for PCT Appl. No. PCT/US2022/012486, mailed May 4, 2022 (10 pages).
International Search Report and Written Opinion for PCT Appl. No. PCT/US2022/012496, mailed Apr. 28, 2022 (11 pages).
Non-Final Office Action on U.S. Appl. No. 18/353,025 DTD Feb. 28, 2025.

* cited by examiner

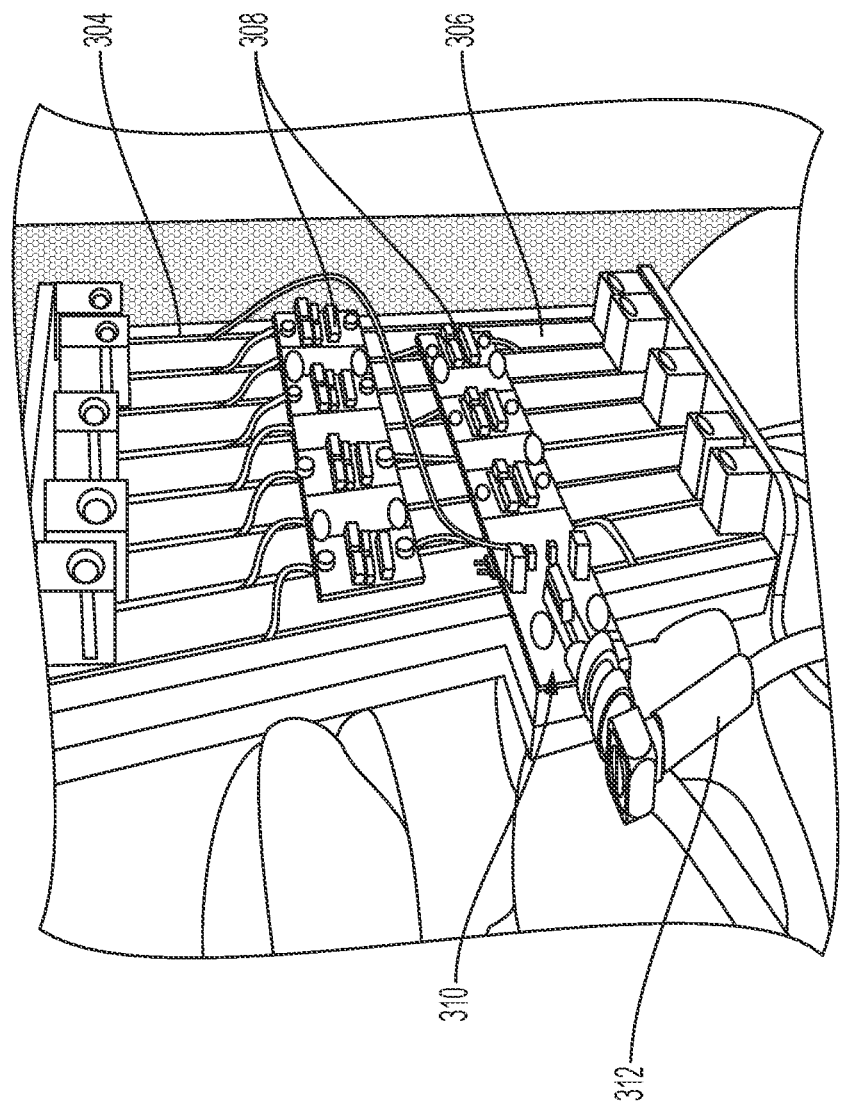

RADIO FREQUENCY COIL FOR MAGNETIC RESONANCE IMAGING

CROSS-REFERENCE TO RELATED APPLICATIONS

This application claims the benefit under 35 U.S.C. § 120 as a continuation of PCT Patent Application No. PCT/US2022/012486, filed on Jan. 14, 2022, which claims benefit under 35 U.S.C. § 119(e) of U.S. provisional patent application Ser. No. 63/137,930, entitled "RADIO FREQUENCY COIL FOR MAGNETIC RESONANCE IMAGING", filed Jan. 15, 2021, the disclosures of which are incorporated herein by reference in their entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

SUMMARY

Some embodiments provide for a radio frequency (RF) coil apparatus configured to facilitate imaging a patient positioned within a magnetic resonance imaging (MRI) system, the MRI system comprising a $B_0$ magnet, the radio frequency coil apparatus comprising: a frame comprising a first plate and a second plate disposed opposite the first plate; and an RF transmit coil comprising a plurality of conductors connected in series, the plurality of conductors being wound around the frame and forming a plurality of turns.

Some embodiments provide for a magnetic resonance imaging (MRI) system configured to image a patient positioned within the MRI system, the MRI system comprising: a $B_0$ magnet that produces a $B_0$ magnetic field; and a radio frequency (RF) coil apparatus comprising: a frame comprising a first plate and a second plate disposed opposite the first plate; and an RF transmit coil comprising a plurality of conductors connected in series, the plurality of conductors being wound around the frame and forming a plurality of turns.

Some embodiments provide for a magnetic resonance imaging (MRI) system configured to image a patient positioned within the MRI system, the MRI system comprising: a $B_0$ magnet that produces a $B_0$ magnetic field; a first radio frequency (RF) coil apparatus comprising: a frame; and an RF transmit coil comprising a plurality of conductors wound around the frame and forming a plurality of turns; and a second RF coil apparatus comprising: at least one RF receive coil configured to detect MR signals produced within the $B_0$ magnetic field.

BRIEF DESCRIPTION OF THE DRAWINGS

Various aspects and embodiments of the disclosed technology will be described with reference to the following figures. It should be appreciated that the figures are not necessarily drawn to scale.

FIGS. 4A-4B illustrate electronics of the example radio frequency coil apparatus of FIGS. 3A-3C, in accordance with some embodiments of the technology described herein.

DETAILED DESCRIPTION

Introduction

Figure 1:
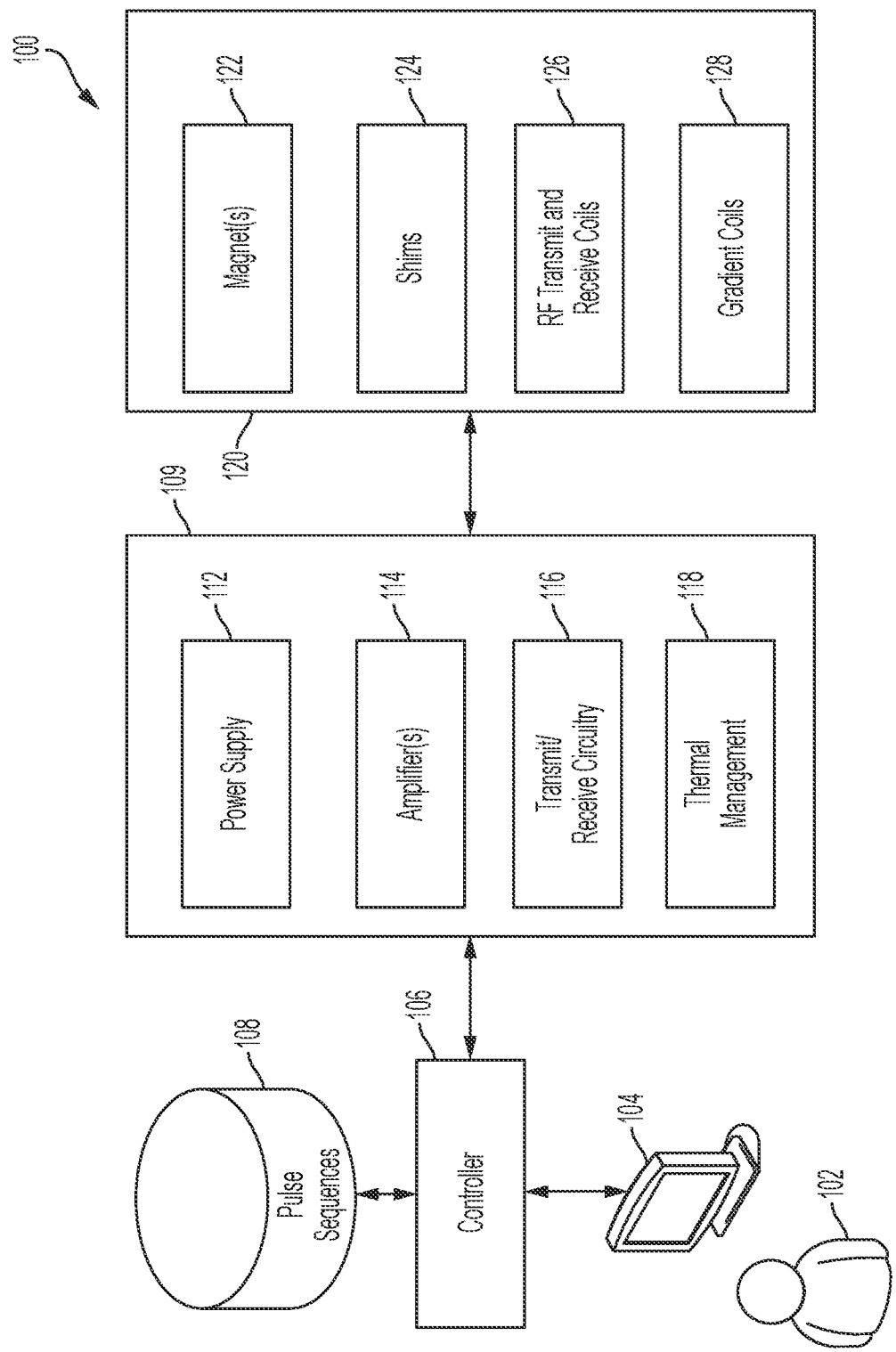
FIG. 1 illustrates example components of a magnetic resonance imaging system, in accordance with some embodiments of the technology described herein.

Aspects of the technology described herein relate to an apparatus and system having a radio frequency (RF) transmit coil integrable with a magnetic resonance imaging (MRI) system to facilitate imaging a patient. According to some embodiments, an RF coil apparatus is provided being configured to optimize the homogeneity of a magnetic field generated by the RF coil apparatus. In some embodiments, the RF coil apparatus is configured to maximize available space in an imaging region of an MRI system for patient anatomy. In some embodiments, the RF coil apparatus is configured such that different RF receive coils can be used interchangeably with the RF coil apparatus.

RF transmit coils generate RF pulses for producing an RF magnetic field perpendicular to the main magnetic field produced by a $B_0$ magnet. The inventors have recognized that an important design criteria for RF transmit coils is configuring the RF transmit coil(s) such that the coil is capable of generating a homogeneous magnetic field. Specifically, the strength of the magnetic field generated by the RF transmit coils should be uniform throughout an imaging region of the MRI system in order to obtain high quality MR images. To ensure the homogeneity of the RF magnetic field, it is advantageous to design the RF transmit so that they are disposed on a rigid substrate.

RF receive coils receive MR signals from nuclear spins excited by the RF pulses transmitted by RF transmit coils. In contrast to RF transmit coils, an important consideration in designing RF receive coils is the maximization of signal-to-noise ratio (SNR). To maximize SNR, it is advantageous to position RF receive coils as close to the patient anatomy being imaged as possible (e.g., being flexibly wrapped around a patient anatomy).

Therefore, RF transmit coils and receive coils have competing design considerations such that combining the RF transmit and receive coils in a single apparatus results in drawbacks to one or both of the design criteria described above. The inventors have recognized, however, that while it is beneficial to position RF receive coils close to patient anatomy, RF transmit coils do not possess the same design requirements for maximizing SNR, but rather prioritize configurations that optimize the homogeneity of the magnetic field generated by the transmit coil. Therefore, RF transmit coils may be spaced away from the patient anatomy without experiencing drawbacks in SNR. Spacing the RF transmit coils away from the patient anatomy may decrease efficiency of the RF transmit coils (e.g., the amount of power necessary to produce a magnetic field of a particular strength), however, the inventors have recognized that the decrease in efficiency of the RF transmit coils may be an acceptable tradeoff for the increased homogeneity of the embodiments described herein. For example, a frame to which the RF transmit coil is adhered may be rigid, so as to ensure that the homogeneity of the magnetic field generated by the RF transmit coil is always the same. As such, the inventors have developed an RF coil apparatus having an RF transmit coil which is wound in a plurality of turns about a frame comprising a first plate and a second plate disposed opposite the first plate. The RF transmit coil may comprise a plurality of conductors connected in series. The first and second plates may be distanced from each other to form an imaging region therebetween having a maximized amount of space for receiving patient anatomy. As the RF transmit and receive coils are separated from each other, any suitable RF receive coil apparatus (e.g., an RF head coil, an RF knee coil) may be used interchangeably with the RF coil apparatus described herein. For example, a flexible or rigid RF receive coil may be used with the RF transmit coils described herein, including the example RF receive coils described in U.S. patent application Ser. No. 15/152,951 filed May 12, 2016 titled "Radio Frequency Coil Methods and Apparatus" and U.S. patent application Ser. No. 15/720,245 filed Sep. 29, 2017 titled "Radio Frequency Coil Tuning Methods and Apparatus", each of which are incorporated by reference herein in their entireties. In some embodiments, the RF coil apparatus may be mechanically and/or electronically coupled to an MRI system (e.g., being integrated into the MRI system).

Thus, aspects of the technology described herein relate to apparatuses and systems for imaging a patient with an improved RF transmit coil. Some embodiments provide for an RF coil apparatus configured to facilitate imaging a patient positioned within an MRI system, the MRI system comprising a $B_0$ magnet, the RF coil apparatus comprising: a frame (for example, a rigid frame) comprising a first plate and a second plate disposed opposite the first plate (e.g., wherein the first and second plates are parallel to each other, for example, with an imaging region disposed therebetween); and an RF transmit coil comprising a plurality of conductors connected in series, the plurality of conductors being wound around the frame and forming a plurality of turns (e.g., eight turns, at least six turns and/or no more than 12 turns).

In some embodiments, the $B_0$ magnet produces a $B_0$ field oriented along a vertical axis and the RF transmit coil is configured to transmit RF pulses that result in magnetic fields perpendicular to the vertical axis.

In some embodiments, the imaging region comprises a spherical volume having a radius of approximately 10 cm.

In some embodiments, each conductor of the plurality of conductors forms a respective one or more the plurality of turns of the RF transmit coil.

In some embodiments, the RF transmit coil is electrically coupled to the MRI system. For example, in some embodiments, the MRI system further comprises a base configured to house electronics for powering the RF transmit coil (e.g., at least one RF amplifier).

In some embodiments, the frame is configured to be mechanically coupled to the MRI system. For example, in some embodiments the frame comprises one or more slots for receiving one or more raised portions of the MRI system.

In some embodiments, the $B_0$ magnet comprises first and second $B_0$ magnets arranged relative to one another so that an imaging region is provided therebetween, and the RF coil apparatus is disposed between the first and second $B_0$ magnets. In some embodiments, the MRI system further comprises first and second sets of gradient coils disposed between the first and second $B_0$ magnets, and the RF coil apparatus is disposed between the first and second sets of gradient coils. In some embodiments, the RF coil apparatus is disposed in a housing of the MRI system.

In some embodiments, the RF transmit coil has a resonant frequency of approximately 2.75 MHz.

In some embodiments, at least one conductor of the plurality of conductors comprises Litz wire.

In some embodiments the frame comprises plastic (e.g., Kydex).

In some embodiments, the frame comprises at least one support separating the first and second plates. In some embodiments, the at least one support is c-shaped.

In some embodiments, the frame comprises a plurality of grooves, and the plurality of conductors are positioned in respective ones of the plurality of grooves. In some embodiments at least one of the plurality of grooves is nonlinear (e.g., comprising one or more peaks and/or valleys).

Some embodiments provide for an MRI system configured to image a patient positioned within the MRI system, the MRI system comprising: a $B_0$ magnet that produces a $B_0$ magnetic field (e.g., having a strength between 0.05 T and 0.1 T, between 0.1 T and 0.2 T), and an RF coil apparatus configured to facilitate imaging a patient positioned within an MRI system, the MRI system comprising a $B_0$ magnet, the RF coil apparatus comprising: a frame (for example, a rigid frame) comprising a first plate and a second plate disposed opposite the first plate (e.g., wherein the first and second plates are parallel to each other, for example, with an imaging region disposed therebetween); and an RF transmit coil comprising a plurality of conductors connected in series, the plurality of conductors being wound around the frame and forming a plurality of turns (e.g., eight turns, at least six turns and/or no more than 12 turns).

In some embodiments, the MRI system further comprises a second RF coil apparatus comprising an RF receive coil.

In some embodiments, the second RF coil apparatus is disposed between the first and second plates of the RF coil apparatus.

Some embodiments provide for an MRI system configured to image a patient positioned within the MRI system, the MRI system comprising: a $B_0$ magnet that produces a $B_0$ magnetic field; a first radio frequency (RF) coil apparatus comprising: a frame; and an RF transmit coil comprising a plurality of conductors connected in series, the plurality of conductors being wound around the frame and forming a plurality of turns; and a second RF coil apparatus comprising: at least one RF receive coil configured to detect MR signals produced within the $B_0$ magnetic field.

In some embodiments, the second RF coil apparatus is disposed between the first and second plates of the first RF coil apparatus. In some embodiments the frame is rigid. In some embodiments, the second RF coil apparatus further comprises a flexible substrate capable of being positioned about an anatomy of the patient; and wherein the at least one RF receive coil comprises a plurality of RF receive coils coupled to the flexible substrate and oriented such that, when the flexible substrate is positioned about the anatomy of the patient and placed within the $B_0$ magnetic field, the plurality of RF receive coils are capable of detecting MR signals produced within the $B_0$ magnetic field.

The aspects and embodiments described above, as well as additional aspects and embodiments, are described further below. These aspects and/or embodiments may be used individually, all together, or in any combination, as the technology is not limited in this respect.

Following below are more detailed descriptions of various concepts related to, and embodiments of, radio frequency coil apparatus configured to operate as a radio frequency transmit coil in a low-field MRI system such as described above in connection with FIGS. 1-2A, though the aspects are not limited for use with any particular MRI system. These aspects and/or embodiments may be used individually, all together, or in any combination, as the technology is not limited in this respect. It should be appreciated that the embodiments described herein may be implemented in any of numerous ways. Examples of specific implementations are provided below for illustrative purposes only. It should be appreciated that the embodiments and the features/capabilities provided may be used individually, all together, or in any combination of two or more, as aspects of the technology described herein are not limited in this respect.

Exemplary Magnetic Resonance Imaging Systems

FIG. 1 illustrates exemplary components of an MRI system which may be used in conjunction with the RF coil apparatus described herein. In the illustrative example of FIG. 1, MRI system 100 comprises computing device 104, controller 106, pulse sequences repository 108, power management system 109, and magnetics components 120. It should be appreciated that MRI system 100 is illustrative and that an MRI system may have one or more other components of any suitable type in addition to or instead of the components illustrated in FIG. 1. However, an MRI system will generally include these high-level components, though the implementation of these components for a particular MRI system may differ. Examples of MRI systems that may be used in accordance with some embodiments of the technology described herein are described in U.S. Pat. No. 10,627,464 filed Jun. 30, 2017 and issued Apr. 21, 2020 and titled "Low-Field Magnetic Resonance Imaging Methods and Apparatus," and U.S. Pat. No. 10,222,434, filed Jan. 24, 2018 and issued Mar. 5, 2019, and titled "Portable Magnetic Resonance Imaging Methods and Apparatus", each of which are incorporated by reference herein in their entireties.

As illustrated in FIG. 1, magnetics components 120 comprise $B_0$ magnets 122, shims 124, radio frequency transmit and receive coils 126, and gradient coils 128. $B_0$ magnets 122 may be used to generate the main magnetic field $B_0$. $B_0$ magnets 122 may be any suitable type or combination of magnetics components that can generate a desired main magnetic $B_0$ field. In some embodiments, $B_0$ magnets 122 may be one or more permanent magnets, one or more electromagnets, one or more superconducting magnets, or a hybrid magnet comprising one or more permanent magnets and one or more electromagnets and/or one or more superconducting magnets. In some embodiments, $B_0$ magnets 122 may be configured to generate a $B_0$ magnetic field having a field strength that is less than or equal to 0.2 T, within a range from 0.1 T to 0.2 T, within a range from 50 mT to 0.1 T, etc.

For example, in some embodiments, $B_0$ magnets 122 may include a first and second $B_0$ magnet, each of the first and second $B_0$ magnet including permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second B magnets.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the B field (the $B_0$ field generated by $B_0$ magnets 122 and/or shims 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. In some embodiments, gradient coils 128 may be implemented using laminate panels (e.g., printed circuit boards), for example, as described in U.S. Pat. No. 9,817,093 filed Sep. 4, 2015 and titled "Low Field Magnetic Resonance Imaging Methods and Apparatus," which is incorporated by reference herein in its entirety.

MRI is performed by exciting and detecting emitted MR signals using transmit and receive coils, respectively (often referred to as radio frequency coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive coils 126 comprises one or more transmit coils that may be used to generate RF pulses to induce an oscillating magnetic field $B_1$. The transmit coil(s) may be configured to generate any suitable types of RF pulses.

In some embodiments, transmit/receive coils comprise one or more coils configured to perform both transmit and receive operations during MR imaging. In some embodiments, transmit/receive coils comprise one or more separate coils, with one or more coils configured to perform transmit operations and one or more coils configured to perform receive operations during MR imaging. When separated, transmit coils may be fixed in a rigid configuration, such as coupled to a rigid frame, as described herein, to maximize the homogeneity of the magnetic field generated by the transmit coil. The receive coils may be flexible, such as fixed to a flexible substrate able to be wrapped around and/or positioned in close proximity to the patient anatomy being imaged in order to maximize SNR of detected MR signals. For example, the receive coils may be configured (e.g., shaped) for imaging a particular patient anatomy, such as a patient's knee, head, etc.

As described herein, one or more of the transmit and receive coils may be configured to be electronically and/or mechanically coupled to the MRI system. For example, one or more of the transmit and receive coils may be removably coupled to the MRI system such that the one or more of the transmit and receive coils may be coupled to an detached from the MRI system as desired.

Power management system 109 includes electronics to provide operating power to one or more components of the MRI system 100. For example, power management system 109 may include one or more power supplies, energy storage devices, gradient power components, transmit coil components, and/or any other suitable power electronics needed to provide suitable operating power to energize and operate components of MRI system 100. As illustrated in FIG. 1, power management system 109 comprises power supply system 112, power component(s) 114, transmit/receive circuitry 116, and thermal management components 118 (e.g., cryogenic cooling equipment for superconducting magnets, water cooling equipment for electromagnets).

Power supply system 112 includes electronics to provide operating power to magnetic components 120 of the MRI system 100. The electronics of power supply system 112 may provide, for example, operating power to one or more gradient coils (e.g., gradient coils 128) to generate one or more gradient magnetic fields to provide spatial encoding of the MR signals. Additionally, the electronics of power supply system 112 may provide operating power to one or more RF coils (e.g., RF transmit and receive coils 126, including RF transmit coil of the RF coil apparatus described herein) to generate and/or receive one or more RF signals from the subject. For example, power supply system 112 may include a power supply configured to provide power from mains electricity to the MRI system and/or an energy storage device. The power supply may, in some embodiments, be an AC-to-DC power supply configured to convert AC power from mains electricity into DC power for use by the MRI system. The energy storage device may, in some embodiments, be any one of a battery, a capacitor, an ultracapacitor, a flywheel, or any other suitable energy storage apparatus that may bidirectionally receive (e.g., store) power from mains electricity and supply power to the MRI system. Additionally, power supply system 112 may include additional power electronics encompassing components including, but not limited to, power converters, switches, buses, drivers, and any other suitable electronics for supplying the MRI system with power.

Amplifiers(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126 including RF receive coil of the RF coil apparatus described herein), one or more gradient power components configured to provide power to one or more gradient coils (e.g., gradient coils 128), and one or more shim power components configured to provide power to one or more shims (e.g., shims 124). In some embodiments the shim may be implemented using permanent magnets, electromagnetics (e.g., a coil), and/or a combination thereof. Transmit/receive circuitry 116 may be used to select whether RF transmit coils or RF receive coils are being operated.

As illustrated in FIG. 1, MRI system 100 includes controller 106 (also referred to as a console) having control electronics to send instructions to and receive information from power management system 109. Controller 106 may be configured to implement one or more pulse sequences, which are used to determine the instructions sent to power management system 109 to operate the magnetic components 120 in a desired sequence (e.g., parameters for operating the RF transmit and receive coils 126, parameters for operating gradient coils 128, etc.).

Examples of pulse sequences include zero echo time (ZTE) pulse sequences, balance steady-state free precession (bSSFP) pulse sequences, gradient echo pulse sequences, spin echo pulse sequences, inversion recovery pulse sequences, arterial spin labeling pulse sequences, diffusion weighted imaging (DWI) pulse sequences, Overhauser imaging pulse sequences, etc., aspects of which are described in U.S. Pat. No. 10,591,561 filed Nov. 11, 2015 and titled "Pulse Sequences for Low Field Magnetic Resonance," which is incorporated by reference herein in its entirety.

As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be located in a same room as the MRI system 100 and/or coupled to the MRI system 100. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect.

Figure 2A:
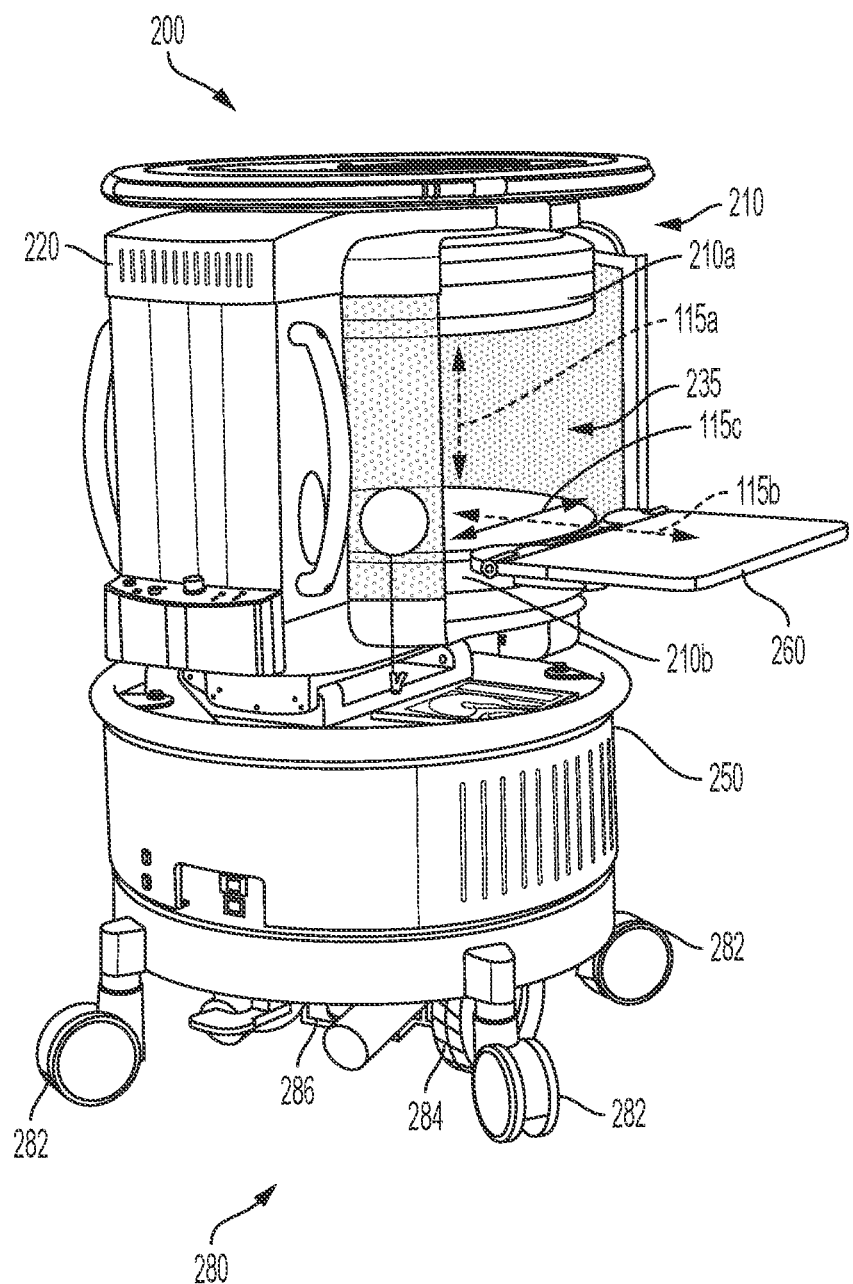
FIG. 2A illustrates an example MRI system, in accordance with some embodiments of the technology described herein.

FIG. 2A illustrates a low power, portable low-field MRI system for which some embodiments of a RF coil apparatus is configured to operate in conjunction with. According to some embodiments, portable MRI system 200 is low-field MRI system operating with a $B_0$ magnetic field of less than or equal to 0.2 T and greater than 0.1 T, and according to some embodiments, portable MRI system 200 is a very low-field MRI system operating with a $B_0$ magnetic field of less than or equal to 0.1 T and greater than 10 mT (e.g., 0.1 T, 50 mT, 20 mT, etc.), that facilitate portable, low-cost, low-power MRI and may significantly increase the availability of MRI in a clinical setting. Portable MRI system 200 comprises a $B_0$ magnet 210 including at least one first permanent magnet 210a and at least one second permanent magnet 210b magnetically coupled to one another by a ferromagnetic yoke 220 configured to capture and channel magnetic flux to increase the magnetic flux density within the imaging region (field of view) of the MRI system. Permanent magnets 210a and 210b may be constructed using any suitable technique, (e.g., using any of the techniques, designs and/or materials described in the '434 patent previously incorporated by reference herein). Yoke 220 may also be constructed using any of suitable technique such as those described in the '434 patent. It should be appreciated that, in some embodiments, $B_0$ magnet 210 may be formed using electromagnets instead in addition to or as an alternative to permanent magnets (e.g., as also described in the '434 patent).

Exemplary $B_0$ magnet 210 illustrated in FIG. 2A is configured in a bi-planar arrangement such that the $B_0$ magnetic field is oriented along a vertical axis 115a. The direction of the $B_0$ magnetic field along the vertical axis for the exemplary configuration illustrated in FIG. 2A may be in either the upward or downward direction. As a result, radio frequency (RF) coils may have a principal axis aligned with a horizontal axis orthogonal to the vertical axis, such as longitudinal axis 115b or axial axis 115c. As described further herein, the inventors have developed an RF coil apparatus having an RF transmit coil for generating an RF magnetic field. The RF coil apparatus may be integrable with an MRI system, such as MRI system 200 shown in FIG. 2A.

$B_0$ magnet 210 may be coupled to or otherwise attached or mounted to base 250 that, in addition to providing the load bearing structures for supporting the $B_0$ magnet, also includes an interior space configured to house electronics needed to operate portable MRI system 200. The exemplary portable MRI system 200 illustrated in FIG. 2A also comprises a conveyance mechanism 280 that allows the portable MRI system to be transported to different locations. The conveyance mechanism may comprise one or more components configured to facilitate movement of the portable MRI system, for example, to a location at which MRI is needed. According to some embodiments, conveyance mechanism comprises a motor 286 coupled to drive wheels 284. In this manner, conveyance mechanism 280 provides motorized assistance in transporting MRI system 200 to desired locations. Conveyance mechanism 280 may also include a plurality of castors 282 to assist with support and stability as well as facilitating transport.

MRI system 200 is also equipped with a fold-out bridge 260 that is capable of being raised (e.g., during transport) and lowered (e.g., as shown in FIG. 2A) to support patient anatomy during imaging, and may include any one or more of the features of a fold-out bridge described in International Publication No. WO 2020/018896 A1, titled "Methods and Apparatus for Patient Positioning in Magnetic Resonance Imaging" (896 application) and filed Jul. 19, 2019, the entirety of which is incorporated by reference herein. This exemplary low-field MRI systems can be used to provide point-of-care MRI, either by bringing the MRI system directly to the patient or bringing the patient to a relatively nearby MRI system (e.g., by wheeling the patient to the MRI system in a standard hospital bed, wheelchair, etc.). The inventors have a radio frequency coil apparatus configured for use in such an MRI system, though the aspects are not limited for use with any particular MRI system.

Figure 2B:
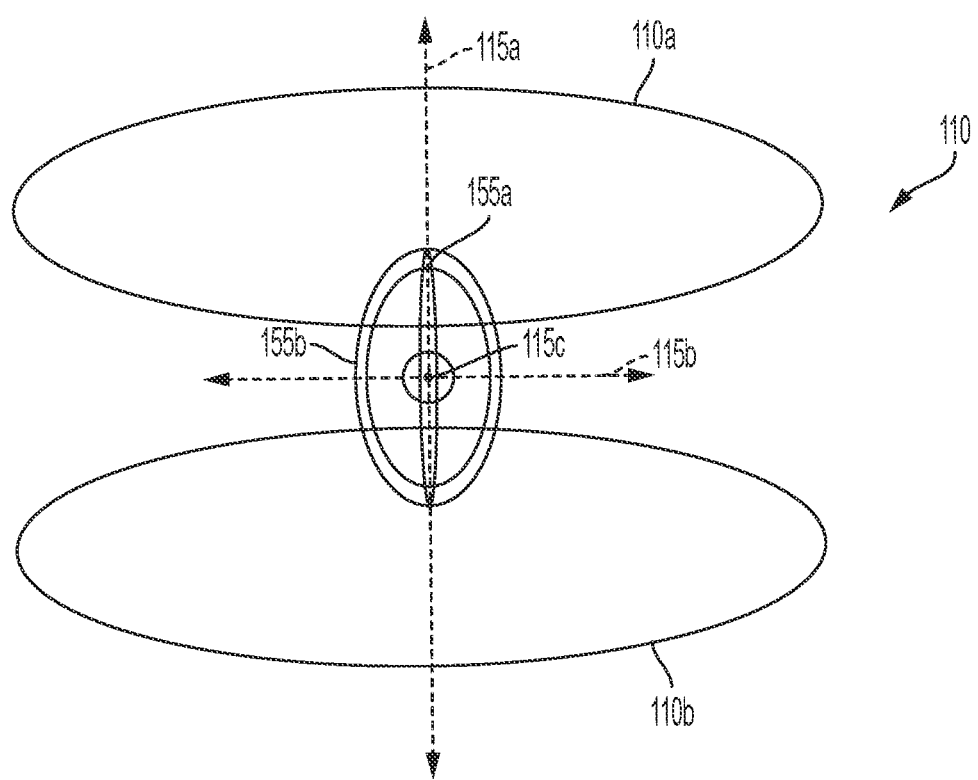
FIG. 2B illustrates an exemplary bi-planar $B_0$ magnetic configuration and radio frequency coils of the example MRI system of FIG. 2A configured to generate radio frequency signals, in accordance with some embodiments of the technology described herein.

FIG. 2B illustrates an exemplary bi-planar $B_0$ magnetic configuration and radio frequency coils of the example MRI system of FIG. 2A configured to generate radio frequency signals, in accordance with some embodiments of the technology described herein. MRI involves placing a subject to be imaged (e.g., all or a portion of patient anatomy) in a static, homogenous magnetic field $B_0$ to align a subject's atomic net magnetization (often represented by a net magnetization vector) in the direction of the $B_0$ field. One or more transmit coils are then used to generate a pulsed magnetic field $B_1$ having a frequency related to the rate of precession of atomic spins of the atoms in the magnetic field $B_0$ to cause the net magnetization of the atoms to develop a component in a direction transverse to the direction of the $B_0$ field. After the $B_1$ field is turned off, the transverse component of the net magnetization vector processes and its magnitude decays over time until the net magnetization re-aligns with the direction of the $B_0$ field if allowed to do so. This process produces MR signals that can be detected, for example, by measuring electrical signals induced in one or more receive coils of the MRI system that are tuned to resonate at the frequency of the MR signals.

MR signals are rotating magnetic fields, often referred to as circularly polarized magnetic fields, that can be viewed as comprising linearly polarized components along orthogonal axes. That is, an MR signal is composed of a first sinusoidal component that oscillates along a first axis and a second sinusoidal component that oscillates along a second axis orthogonal to the first axis. The first sinusoidal component and the second sinusoidal component oscillate 90° out-of-phase with each other. An appropriately arranged coil tuned to the resonant frequency of the MR signals can detect a linearly polarized component along one of the orthogonal axes. In particular, an electrical response may be induced in a tuned receive coil by the linearly polarized component of an MR signal that is oriented along an axis approximately orthogonal to the current loop of the coil, referred to herein as the principal axis of the coil.

Accordingly, radio frequency coils configured to excite and detect MR signals, which may include separate coils for transmitting and receiving, multiple coils for transmitting and/or receiving, or the same coils for transmitting and receiving, need to be oriented appropriately relative to the $B_0$ magnetic field to perform MRI. Whereas conventional high-field MRI scanners produce a $B_0$ field oriented in directions along a horizontal axis (e.g., along the longitudinal axis of the bore), exemplary low-field MRI devices described herein produce a $B_0$ field oriented in directions along a vertical axis. For example, FIG. 2B illustrates an exemplary bi-planar geometry for a $B_0$ magnet, in accordance with some embodiments. $B_0$ magnet 110 is schematically illustrated by magnet 110a and 100b arranged substantially parallel to one another to generate a $B_0$ field generally along axis 115a (either in the upward or downward direction) to provide a field of view between the magnets 110a and 100b (i.e., a region between the magnets wherein the homogeneity of the $B_0$ field is suitable for MRI).

A first RF coil (or multiple RF coils) is schematically illustrated as RF coil 155a, which is/are arranged to generate a pulsed oscillating magnetic field generally along axis 115b (i.e., the principal axis of RF coil(s) 155a) to stimulate an MR response and/or to detect the MR signal component oriented substantially along the principal axis 115b (i.e., linearly polarized components of the MR signal aligned with the coil's principal axis). A second RF coil (or multiple RF coils) is schematically illustrated as RF coil 155b, which is/are arranged to generate a pulsed oscillating magnetic field generally along axis 115c (i.e., the principal axis of RF coil(s) 150c into and out of the plane of the drawing) to stimulate an MR response and/or to detect the MR signal component oriented substantially along the principal axis 115c (i.e., linearly polarized components of the MR signal aligned with the coil's principal axis).

The inventors have developed an RF coil apparatus having an RF transmit coil configured to operate in conjunction with these low-field MRI devices by providing an RF transmit coil comprising a plurality of conductors connected in series wound in a plurality of turns about a frame comprising a first plate and a second plate disposed opposite the first plate that when positioned about a patient's anatomy to be imaged is configured to transmit RF pulses to generate an RF magnetic field.

As described herein, to transmit excitation pulse sequences and to detect emitted MR signals, transmit/receive coils must resonate at a precession frequency (referred to as the Larmor frequency for hydrogen) that relates to the strength of the $B_0$ field. That is, as the strength of the $B_0$ field increases, so does the corresponding precession frequency. Accordingly, transmit/receive coils in the high-field regime must resonate at significantly higher frequencies (shorter wavelengths) than their low-field counterparts. As such, the lower resonant frequencies associated with low-field MRI facilitate different radio frequency coil design for apparatus configured to operate in the low-field regime. For example, the length of a conducting path of a resonant coil is constrained by the frequency at which the resonant coil is intended to resonate. In particular, the higher the frequency, the shorter the conductive path must be between capacitive junctions for the resonant coil to operate satisfactorily. Thus, the conducting paths of high-field transmit/receive coils are required to be very short. To meet this requirement, high-field transmit/receive coils are frequently single turn conductive loops formed by etching, cutting or milling conductive sheets (e.g., copper sheets). The single turn conductive loops may have many capacitive junctions (e.g., capacitors disposed in series). Typical conducting paths for high-field transmit/receive coils are limited in length to tens of centimeters between respective capacitors.

The low frequencies involved in low-field MRI permit the conducting paths of transmit/receive coils to be quite long, allowing for radio frequency coils to comprise a plurality of turns or loops. As used herein, a "turn" refers to a conductive path provided 360° or substantially 360° about a reference axis (e.g., the principal axis of the coil, as discussed in further detail below). It should be appreciated that a turn need not form a closed loop provided the conductive path is formed substantially 360° about the reference axis. A general rule of thumb prescribes that the length of the conductor in a resonant coil should not exceed one tenth of the wavelength at the resonant frequency. Thus, a high-field MRI system with a $B_0$ magnetic field of 3 T operates at approximately 128 MHz and so has a wavelength of approximately 2.3 meters. Thus, the length of the conductors in the transmit/receive coils for such a high-field system should not exceed 23 centimeters. By contrast, a low-field MRI system with a $B_0$ field of 0.2 T operates at approximately 8.5 MHz and so has a wavelength of approximately 35 meters and therefore transmit/receive coils can include conductors having lengths up to approximately 3.5 meters.

A low field MRI system with a $B_0$ field of 0.1 T operates at approximately 4.3 MHz and so has a wavelength of approximately 70 meters and therefore transmit/receive coils can include conductors having lengths up to approximately 7 meters. A low-field MRI system with a $B_0$ field of 0.05 T operates at approximately 2.15 MHz (~140 meter wavelength) and corresponding transmit/receive coils can utilize conductors having lengths up to 14 meters, and so on. The inventors have recognized that the significantly longer conductor lengths permitted in the low-field regime allows for radio frequency coils having multiple turns (e.g., 5, 10, 15, 20, 30, 50 turns or more). In some embodiments, an RF coil comprises at least 6 turns and/or no more than 12 turns. In some embodiments an RF coil comprises 8 turns. The respective turns may be coupled together by respective capacitors. A length of a conductor between two capacitors may comprise a turn, in some embodiments. Exemplary coils having conductors arranged in a plurality of turns are discussed in further detail below.

Exemplary Radio Frequency Coil Apparatuses

Figure 3A:
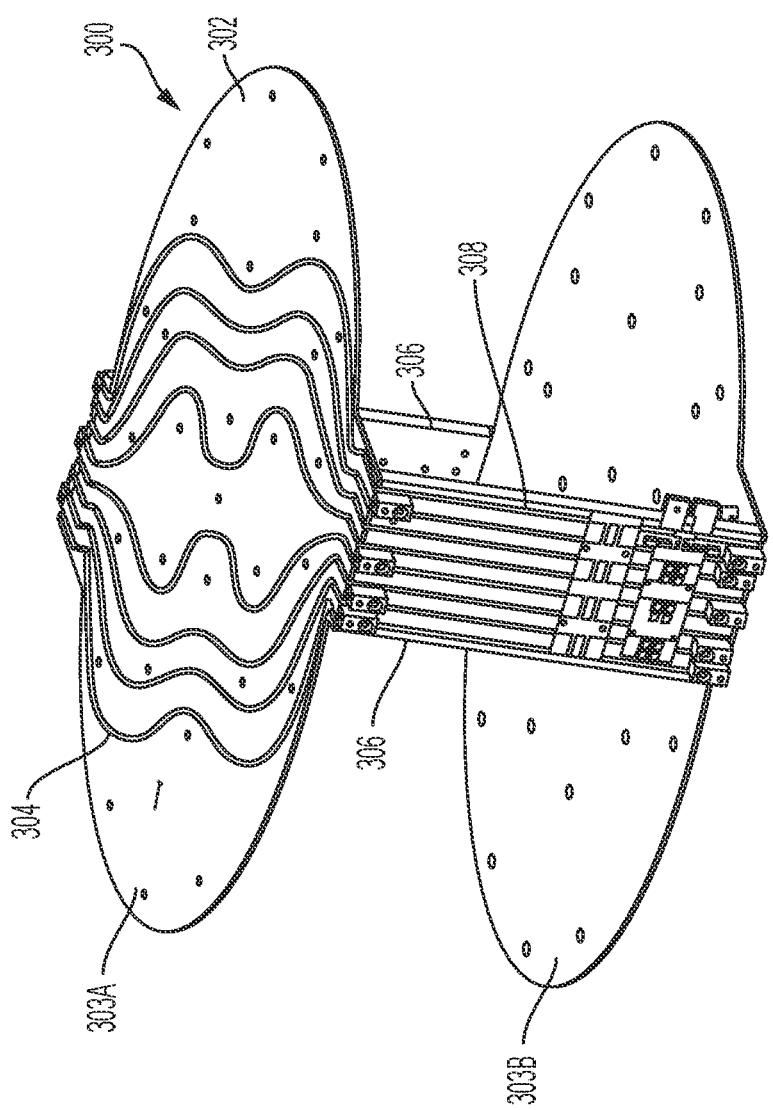
FIGS. 3A-3C illustrate an example radio frequency coil apparatus, in accordance with some embodiments of the technology described herein.
Figure 3B:
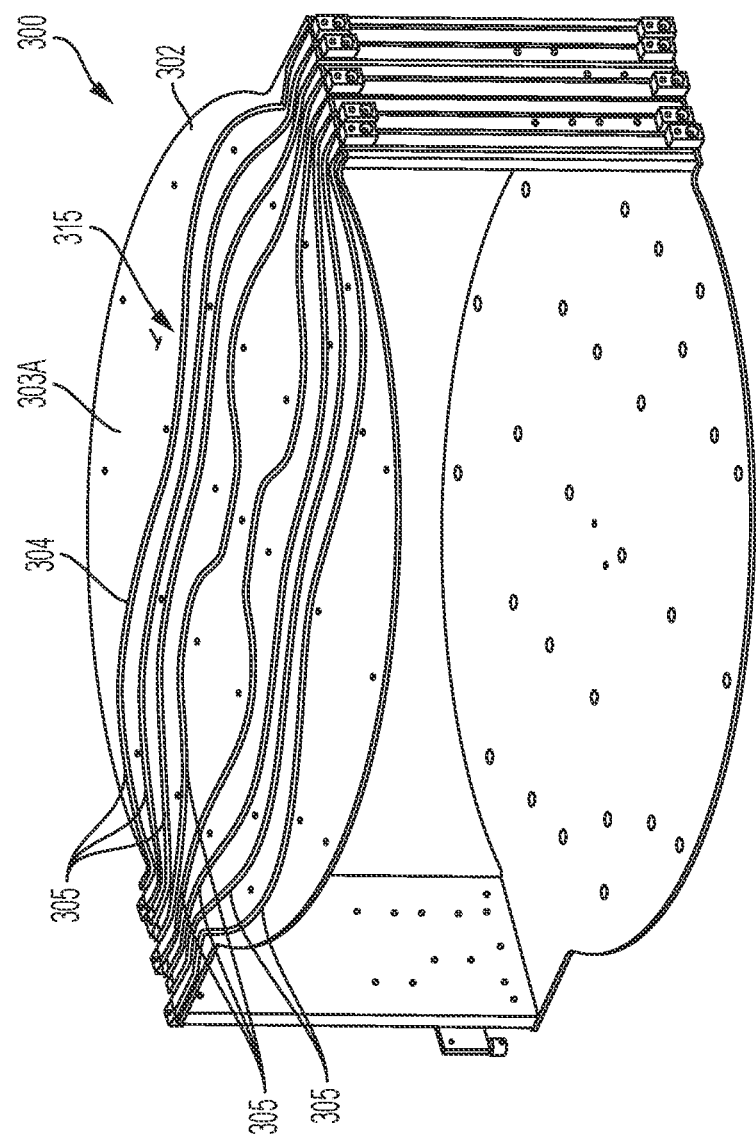
Figure 3C:
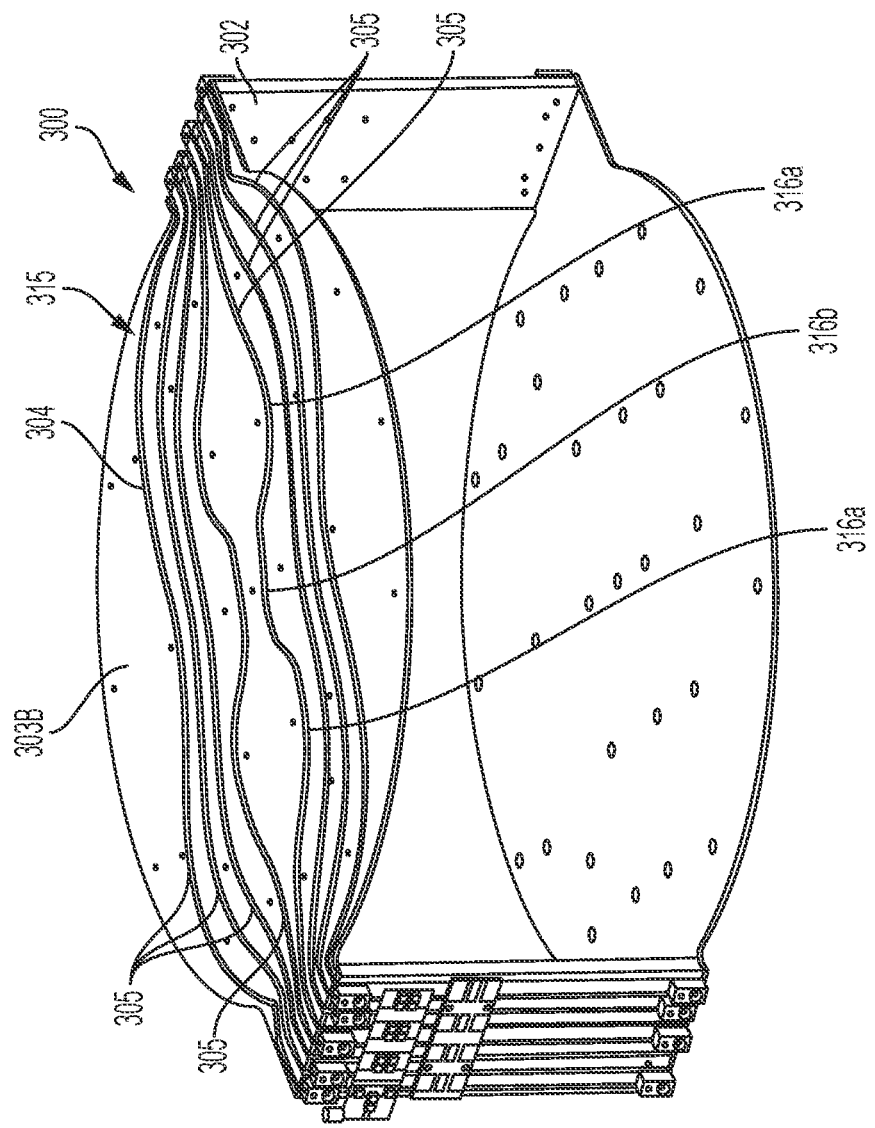

For example, FIGS. 3A-3C illustrate an example radio frequency coil apparatus, in accordance with some embodiments of the technology described herein. As shown in FIG. 3A, RF coil apparatus 300 comprises a frame 302 and a coil 304 for transmitting RF signals. Coil 304 is wound around frame 302 as is further described herein.

Frame 302 comprises a first plate 303A and a second plate 303B. Second plate 303B is disposed opposite the first plate 303A. An imaging region for receiving and imaging a patient anatomy may be formed in the space between the first and second plates 303A-B. In the illustrated embodiment of FIG. 3A, the first and second plates 303A-B are substantially parallel to each other which may enhance the homogeneity of the magnetic field generated by coil 304, as described herein.

Frame 302 may be made of any suitable material. For example, frame 302 may be made of a non-ferrous material, such as plastic (e.g., Kydex). Frame 302 may be rigid, to prevent deformation of the frame 302. As described herein, an important design criteria for RF transmit coils is configuring the coil to be wound about a rigid frame to ensure the homogeneity of the magnetic field generated by the coil is optimized and remains constant as opposed to fluctuating as may occur in a flexible coil. Thus, use of a rigid frame 302 assists in enhancing the stability of the homogeneous magnetic field generated by coil 304.

In the illustrated embodiment, first and second plates 303A-B are disk-shaped, however other suitable shapes are possible, and aspects of the technology are not limited in this respect. The first and second plates 303A-B may be substantially the same size, in some embodiments (e.g., having a diameter of approximately 60 cm).

Frame 302 further comprises supports 306. Supports 306 separate first and second plates 303A-B to form an imaging region therebetween, as described herein. The supports 306 may separate first and second plates 303A-B such that imaging region comprises a spherical volume having a radius of approximately 10 cm. In some embodiments, the spherical volume comprises a radius of at least 5 cm, 6 cm, 7 cm, 8 cm, 9 cm, 10 cm, etc. For example, supports have a height of approximately 30 cm each. In the illustrated embodiment, the frame comprises two supports, however other configurations are possible (e.g., 1 support, 3 supports, etc.). As shown in FIGS. 3A-3C, supports 306 are c-shaped.

Coil 304 may be an RF transmit coil configured to transmit RF pulses to induce an oscillating magnetic field B1. As described herein, an RF transmit coil may be spaced apart from patient anatomy without significant drawbacks in homogeneity performance.

Coil 304 may comprise at least one conductor. In some embodiments, coil 304 comprises a plurality of conductors. In such embodiments, the plurality of conductors may be connected together in series at capacitive junctions.

As described herein, the efficiency of an RF coil is proportional to the Quality factor (Q) of the coil. Q is equal to the ratio of reactance to resistance. While resistance is proportional to the number of turns of the coil, reactance is proportional to the number of turns squared. Therefore, increasing the number of windings linearly increases Q as well as efficiency of the coil. However, the resistance and/or reactance of the coil may be dependent on (e.g., proportional to) one or more other characteristics in addition to the number of turns of the coil.

To optimize the uniformity of the field and to prevent proximity effects which would cause the resistance of the coil to increase at a faster rate than proportionally to the number of turns of the coil, the turns of the coil may be spaced apart from each other as shown in FIGS. 3A-3C and described herein. The pattern of windings shown in FIGS. 3A-3C and described herein is a result of optimizing the uniformity of the magnetic field generated by the RF transmit coil. The optimization is based on an assumption that RF current magnitude and phase are the same for all turns of the coil. To ensure that this assumption is true, the conductors of the coil (and as a result, the coil turns) are disposed in series. Configuring the conductors and turns in a parallel configuration introduces problems in ensuring current is split evenly between the turns of the coil.

In some embodiments, conductor(s) of the coil 304 comprise Litz wire. Multi-stranded Litz wire comprises thousands of wires bound together in a braid. Current is split between the multiple wires thereby decreasing current density in each strand of wire. The distribution of current between the wires increases gain, in turn increasing efficiency of the circuit formed by the wire (by increasing the Quality factor (Q) of the circuit).

In some embodiments, conductor(s) of coil 304 comprise copper wire. The resistance of a wire is inversely proportional to the radius of the wire. Therefore, copper wires having increased diameter may be used in some embodiments to achieve a target series resistance.

In some embodiments, coil 304 may be configured to operate in the low-field regime, for example, in combination with a low-field MRI system as described herein. In such embodiments where coil 304 is configured to operate in the low-field regime, coil 304 may have significantly larger dimensions of uninterrupted conductor length than conventional RF coils configured to operate in the high-field regime due to the lower resonant frequency involved in low-field MRI, as discussed above. For example, the coil 304 may have a length of approximately 14 meters. In some embodiments, the coil comprises a length of at least 5 meters, at least 10 meters, at least 11 meters, at least 12 meters, at least 13 meters, at least 14 meters, etc. It should be appreciated that the specific dimensions illustrated are exemplary and may be chosen to be smaller or larger.

As described herein, the coil 304 may be constructed from one or more conductors. The conductor(s) may be wound around the frame 302 in a plurality of turns 305. For example, the frame 302 may comprise a plurality of grooves in which conductors of the coil 304 are disposed. For example, as shown in FIGS. 3B-3C, each of the first plate 303A and the second plate 303B comprise multiple grooves 315. Each of the plurality of grooves 315 may comprise a path which extends around the frame 302 along each of the first and second plates 303A-B. Each path may form a substantially closed loop. One turn of the coil may comprise the length of the coil which is disposed in a single path formed by a groove of the plurality of grooves 315. Therefore, one turn extends along each of the first and second plates 303A-B and forming a substantially closed loop interrupted only by electronics 308 of the RF coil apparatus 300, as described herein. In some embodiments, each conductor of the plurality of conductors may be disposed in a one of the plurality grooves and comprising one of the plurality of turns. In some embodiments, each turn comprises multiple conductors.

Each conductor may have a length of approximately 180 cm. The conductor length may comprise a conductive path uninterrupted by electronics such as capacitors, as described herein. The conductors may be coupled together at capacitive junctions comprising at least one capacitor, as described herein. The length of a conductor between respective capacitive junctions may comprise a turn. As such, each turn of the coil 304 may have a length of approximately 180 cm. In some embodiments, each conductor and/or each turn has a length of at least 100 cm, at least 150 cm, at least 175 cm, etc.

The number of turns may be designed to maximize the efficiency of the coil 304. The efficiency of the coil 304 may be referred to as the power needed to generate a particular magnetic field. The Quality factor (Q) which is indicative of efficiency may be represented by the ratio of reactance to resistance. The reactance of the coil increases with the square of the number of turns of the coil while the resistance of the coil increases linearly with the number of turns. Therefore, increasing the number of turns increases Q which increases efficiency.

The number of turns of the coil 304 may be optimized, as the inventors have recognized that increasing the number of turns of the coil can have diminishing returns. Specifically, the increase in efficiency decreases with each additional turn of the coil. In some embodiments, the plurality of turns comprises at least six turns. In some embodiments, the plurality of turns comprises no more than 12 turns. In the illustrated embodiment of FIGS. 3A-3C, the plurality of turns 305 comprises 8 turns. However, any number of turns can be selected and the optimal number of turns may depend on the geometry of the RF coil apparatus (e.g., the type of patient anatomy the apparatus is configured to surround), the type of conductor and method of fabrication and/or desired operating characteristics of the RF transmit coil.

The plurality of grooves 315 may be shaped non-linearly, as shown in the illustrated embodiments of FIGS. 3A-3C. For example, at least one groove of the plurality of grooves 315 may be undulating, having multiple (e.g., at least two) undulation points 316 (e.g., the undulation points comprising a peak or a valley). In some embodiments, at least one groove of the plurality of grooves comprises one or more peaks 316a and one or more valleys 316b. As shown in FIG. 3C, a peak 316a may refer to a point on a groove that is a local maximum and a valley may refer to a point on a groove that is a local minimum. In some embodiments, as shown in FIGS. 3A-3C, the undulation of at least some of the plurality of grooves 315 (e.g., the position, amount, and/or height of the one or more peaks and valleys) may differ from others of the plurality of grooves 315.

The undulation of the grooves 315 may be chosen to optimize the homogeneity of the magnetic field. For example, the pattern of grooves 315 may be chosen with the overall goal of optimizing the uniformity of the magnetic field generated by the RF transmit coil. Deviation from a target magnetic field uniformity may be measured over the volume of the imaging region for each fragment of the RF coil. The orientation of each coil fragment may be chosen such that deviation from the target magnetic field is minimized, resulting in a pattern as shown in FIGS. 3A-3C.

Figure 3D:
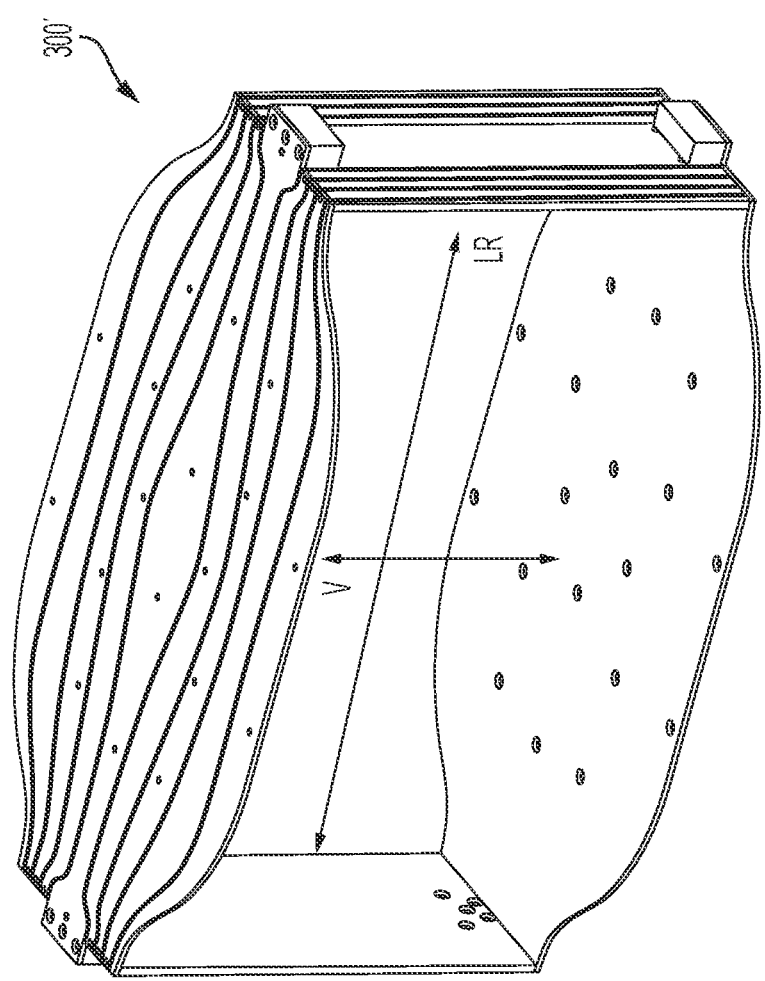
FIG. 3D illustrates a second configuration of the example radio frequency coil apparatus of FIGS. 3A-3C, in accordance with some embodiments of the technology described herein.

FIG. 3D illustrates a second configuration of the example radio frequency coil apparatus of FIGS. 3A-3C, in accordance with some embodiments of the technology described herein. As shown in FIGS. 3A-3C, plates of the RF coil apparatus 300 are rotationally offset about a vertical axis extending through first and second plates 303A-B. In contrast, the example radio frequency coil apparatus 300' has no rotational offset about the vertical axis.

The example radio frequency coil apparatus 300' may have enlarged dimensions to ensure sufficient space between plates of a frame of the RF coil apparatus 300' for receiving a patient anatomy. For example, a vertical dimension (V) of an RF coil apparatus may be at least 200 mm, at least 250 mm, at least 275 mm, at least 300 mm, at least 325 mm, at least 350 mm, or more. A vertical distance between plates of the RF coil apparatus 300' may be at least 350 mm. A horizontal dimension (LR) of the respective plates of an RF coil apparatus and between posts of the frame of the RF coil apparatus may be at least 550 mm, at least 575 mm, at least 600 mm, at least 625 mm, at least 650 mm, at least 675 mm, or more. A horizontal dimension of the respective plates of the RF coil apparatus 300' and between posts of the frame of the RF coil apparatus 300' may be at least 675 mm.

Figure 4A:
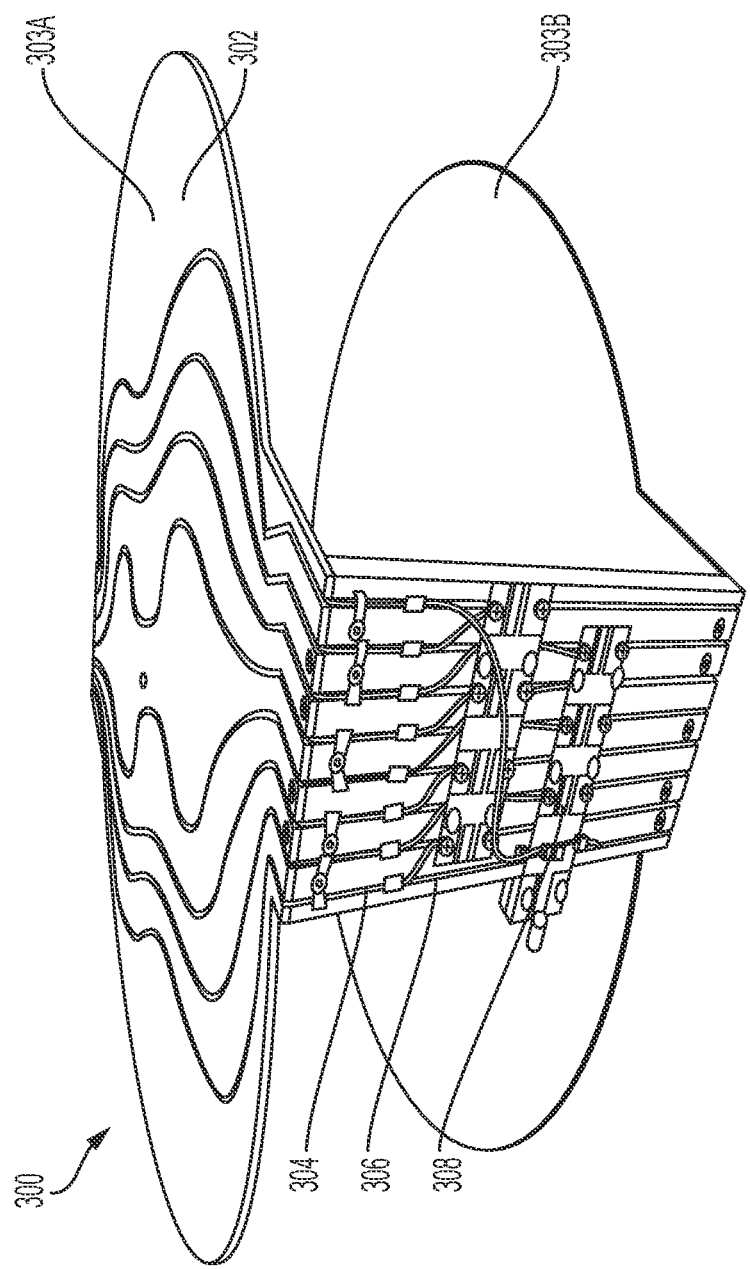

FIGS. 4A-4B illustrate electronics 308 of the example radio frequency coil apparatus of FIGS. 3A-3C, in accordance with some embodiments of the technology described herein. As described herein, each turn 305 of coil 304 may form a substantially closed loop, being interrupted only by electronics 308. Electronics 308 may include any electronic components used to transmit RF pulses from the coil 304 to the imaging region.

As shown in FIGS. 4A-4B, electronics 308 includes tuning board 310 and power connection 312. To electrically connect RF coil apparatus 300 to the electronics of an MRI system, electronics 310 may include, for example, power connection 312 that allows a wire bundle or coaxial cable to connect with a cooperating connector on the MRI system to exchange signals, provide power and/or otherwise electrically connect the RF coil apparatus 300 to a corresponding MRI system for which the apparatus is configured to operate.

Figure 5:
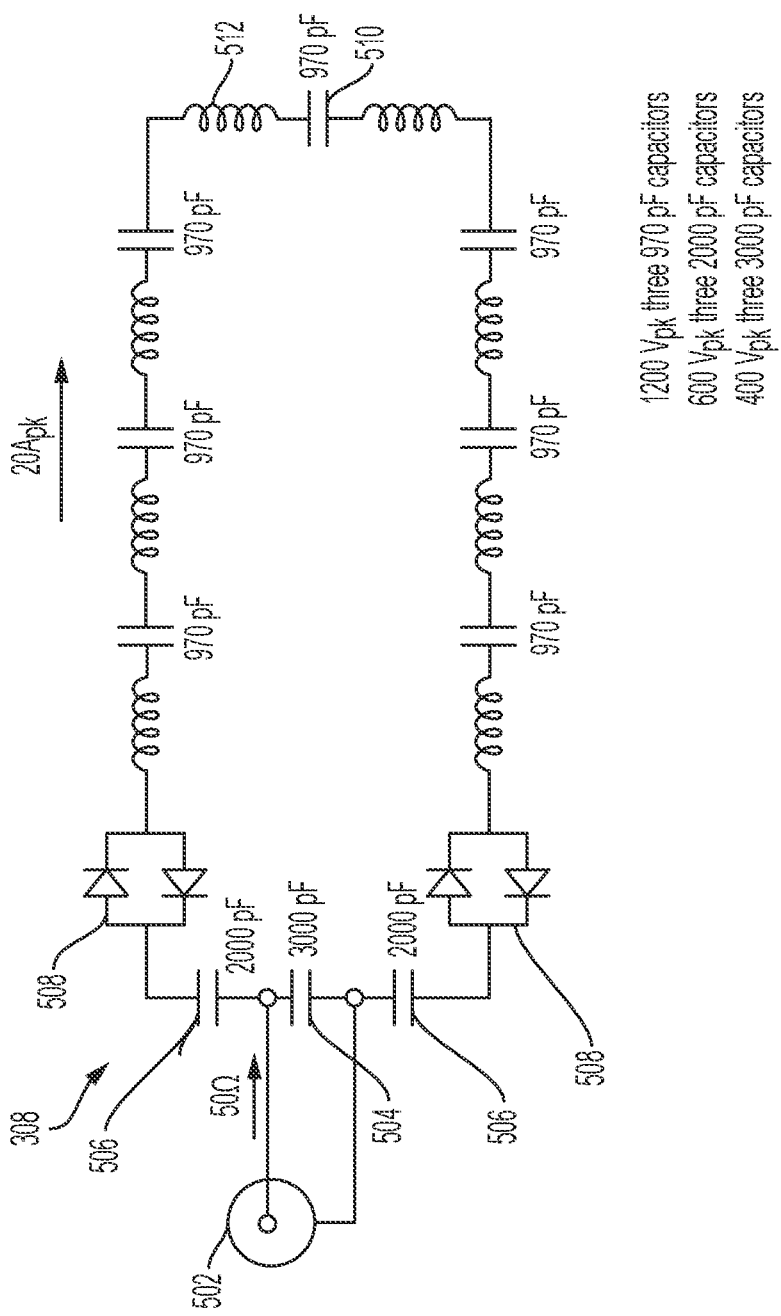
FIG. 5 illustrates a schematic circuit diagram of the electronics of the example radio frequency coil apparatus of FIGS. 3A-3C, in accordance with some embodiments of the technology described herein.

A first turn of the plurality of turns 304 may comprise tuning board 310. Tuning board 310, as described further herein, may perform impedance matching for coil 304. In particular, tuning board 310 may ensure that the impedance is of coil 304 is maintained at a constant value (e.g., 50 ohms). As shown in FIG. 5, tuning board 310 comprises capacitors 504, 506. Capacitors 504, 506 have capacitances of 3000 pf and 2000 pf, respectively, in the illustrated embodiment of FIG. 5. The impedance matching performed by the tuning board 310 facilitates maximum power transfer. In particular, the impedance matching helps ensure that substantially all power transmitted to coil 304 from a power amplifier is received by the coil, and that none of the transmitted power is reflected back to the amplifier.

FIG. 5 illustrates a schematic circuit diagram of the electronics of the example radio frequency coil apparatus of FIGS. 3A-3C, in accordance with some embodiments of the technology described herein. As shown in FIG. 5, electronics 308 comprises a power connection 502, capacitors 504, 506 of tuning board 310, diodes 508, and multiple capacitors 510 and inductors 512 disposed in series.

Each turn 305 of coil 304 may comprise an inductor-capacitor pair comprising an inductor 512 and a capacitor 510. As described herein, the coil 304 of the illustrated embodiment comprises eight turns. As such, the electronics 308 shown in FIG. 5 comprises 8 inductors 512 and 7 capacitors 510 (with a first turn of the plurality of turns 305 comprising capacitors 504, 506 of tuning board 310). Capacitors 510 may cause the coil 304 to be resonant at approximately 2.75 MHz. In the illustrated embodiment, capacitors 510 have a capacitance of 970 pf. As shown in FIG. 5, a peak current of 20 amps may flows through coil 304 along the plurality of turns.

Electronics 308 further comprise diodes 508 disposed in series. The diodes 508 may comprise Schottky diodes. Diodes 508 may be configured to cause coil 504 to be non-resonant during a receive operation (e.g., when RF receive coils are receiving MR signal).

Figure 6:
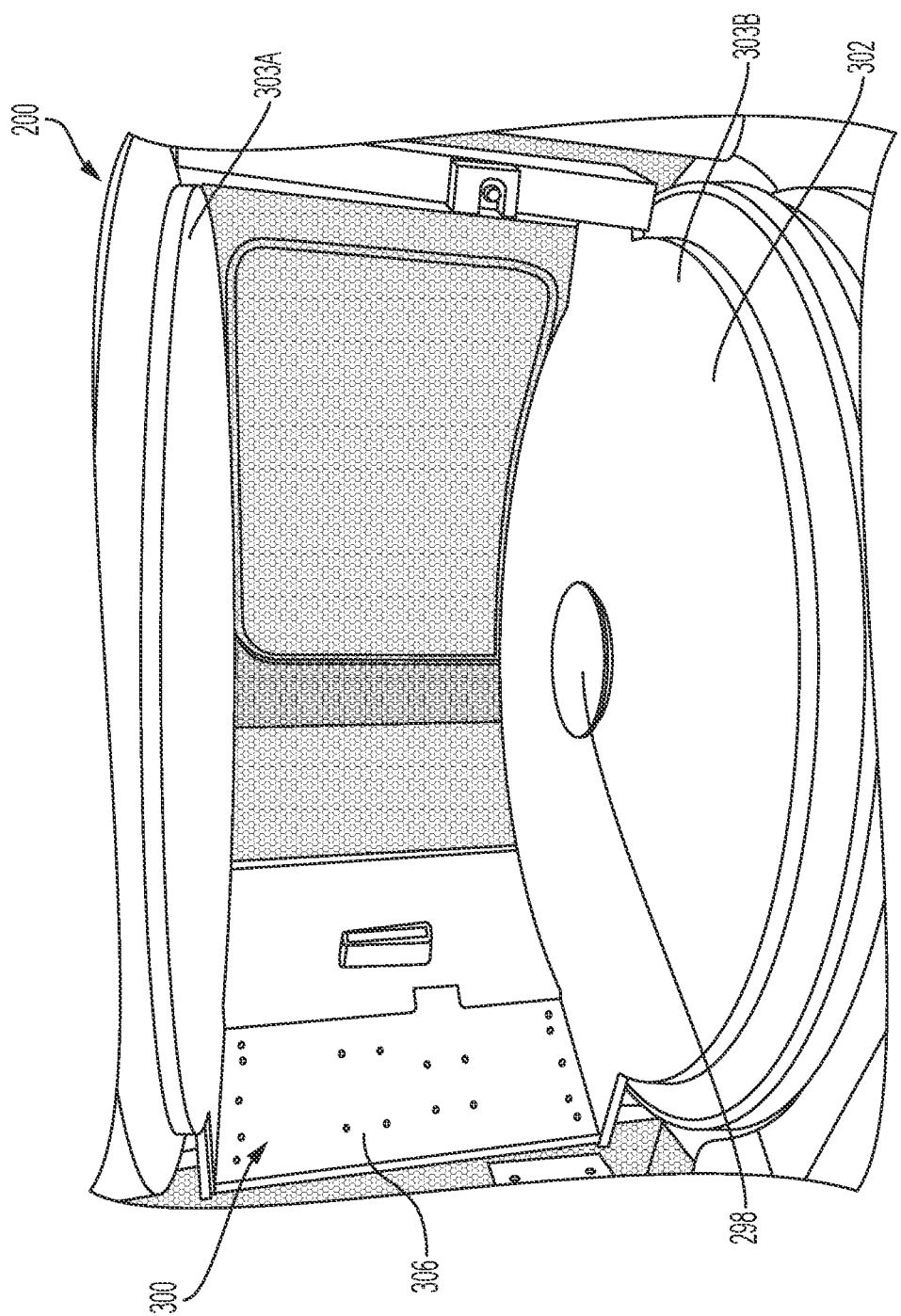
FIG. 6 illustrates the example radio frequency coil apparatus of FIGS. 3A-3C inserted into an imaging region of the example MRI system of FIG. 2, in accordance with some embodiments of the technology described herein.

FIG. 6 illustrates the example radio frequency coil apparatus of FIGS. 3A-3C inserted into an imaging region of the example MRI system of FIG. 2, in accordance with some embodiments of the technology described herein. As described herein, the RF coil apparatus 200 may be used in conjunction with an MRI system, such as MRI system 200 shown in FIG. 2A. In some embodiments, the $B_0$ field of the MRI system 200 is oriented substantially perpendicular to the longitudinal axis of the patient's anatomy, as opposed to conventional MRI systems that produce a $B_0$ field that is substantially aligned with the longitudinal axis of the anatomy being imaged (e.g., conventional high-field MRI systems that employ a solenoid coil positioned about a longitudinal bore to generate a main $B_0$ magnetic field aligned with the horizontal axis). As a result, radio frequency coils configured for use with exemplary low-field MRI systems described herein may be oriented differently than radio frequency coils employed in conventional high-field MRI. For example, the $B_0$ field produced by the MRI system 200 may be oriented along a vertical axis and the RF transmit coil may be configured to transmit RF pulses perpendicular to the vertical axis.

In some embodiments, the RF coil apparatus 300 may be configured to work in conjunction with a second RF coil apparatus, such as an RF coil apparatus comprising at least one RF receive coil configured to detect MR signals from nuclear spins excited by the RF pulses transmitted by transmit coil 304 of the RF coil apparatus 300. In this way, RF coil apparatus 300 and the second RF coil apparatus may facilitate imaging of a patient positioned within the MRI system.

The second RF coil apparatus may be any suitable RF coil apparatus including any apparatus described in U.S. patent application Ser. No. 16/864,848 filed May 1, 2020 and titled "Systems, Devices, and Methods for Magnetic Resonance Imaging of Infants", U.S. patent application Ser. No. 15/152,951 filed May 12, 2016 and titled "Radio Frequency Coil Methods and Apparatus", U.S. patent application Ser. No. 16/516,373 filed Jul. 19, 2019 and titled "Methods and Apparatus for Patient Positioning in Magnetic Resonance Imaging", and U.S. patent application Ser. No. 16/815,534 filed Mar. 11, 2020 and titled "Systems and Methods for Magnetic Resonance Imaging of Infants", each of which are incorporated by reference herein in its entirety. For example, second RF coil apparatus have any suitable number of coils configured to detect MR signals (e.g., a single coil, multiple coils). The second RF coil apparatus may be configured for imaging a particular portion of a patient anatomy (e.g., a patient's head, a patient's knee), in some embodiments. As described herein, an important design criteria of RF receive coils is configuring the RF receive coils in close proximity to the patient anatomy being imaged in order to increase SNR. Thus, in some embodiments, the second RF coil apparatus may be disposed between first and second plates 303A-B of RF coil apparatus 300 in an imaging region of the MRI system 200 while the RF coil apparatus 300 including coil 304 is spaced away from the patient anatomy. As such, SNR of MR signals detected from the patient anatomy may be maximized while also maximizing the remaining space available in the imaging region for the patient anatomy (including anatomy not currently being imaged).

In some embodiments, the second RF coil apparatus may be coupled to the MRI system 200. For example, the second RF coil apparatus may have components being configured to couple with coupling mechanism 298 of MRI system 200, such as those described in the '534, '373, '951, and '848 patent applications previously incorporated by reference herein. As such, the second RF coil apparatus may be easily interchangeable to allow for different ones of second RF coil apparatus (e.g., apparatuses configured to be used for imaging different parts of a patient's body) to be used in combination with RF coil apparatus 300.

As described herein, the RF coil apparatus 300 may be integrable with the MRI system. In some embodiments, the RF coil apparatus 300 may be disposed between first and second $B_0$ magnets of the MRI system 200, such as $B_0$ magnets 210a-b. In some embodiments, the MRI system further comprises gradient coils. In some embodiments, the gradients coils comprise first and second sets of gradient coils respectively disposed between a respective $B_0$ magnet and plate of RF coil apparatus 300. In some embodiments, the MRI system further comprises a gradient shield for shielding gradient coils from the magnetic field generated by the RF coils and thereby reducing eddy currents and/or a shim plate disposed between respective plates of the RF coil apparatus 300 and gradient coils of the MRI system 200.

In some embodiments the RF coil apparatus 300 is housed within the MRI system 200. For example, the RF coil apparatus 300 may be disposed within a housing of the MRI system 200. The housing may house other components of the MRI system 300 such as one or more $B_0$ magnets, gradient coils, and the like.

Figure 7:
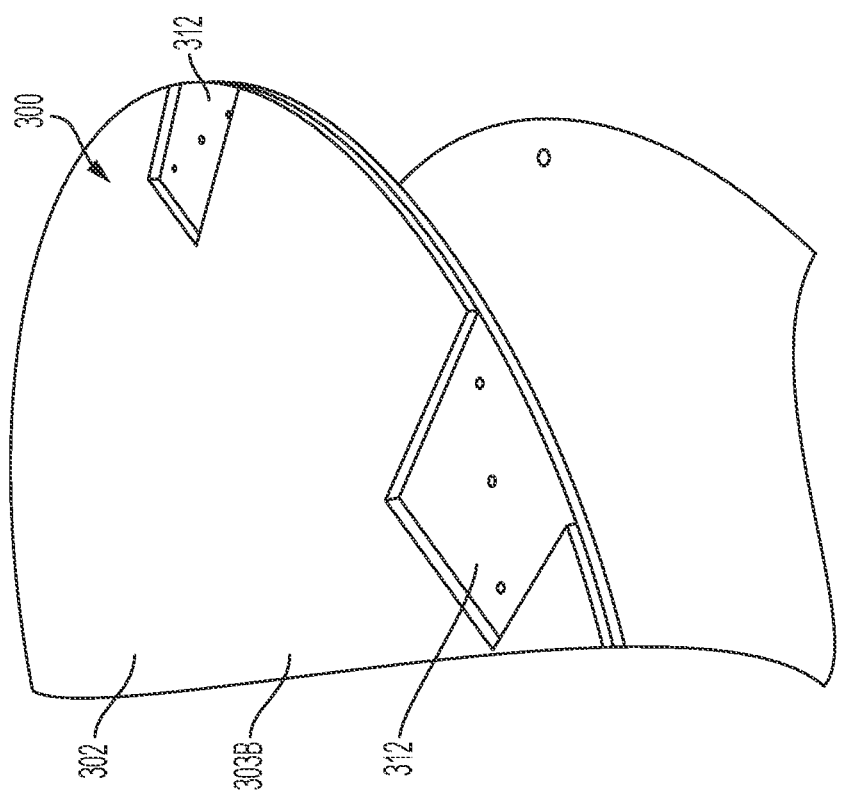
FIG. 7 illustrates an example positioning mechanism of the example radio frequency coil apparatus of FIGS. 3A-3C, in accordance with some embodiments of the technology described herein.
Figure 8:
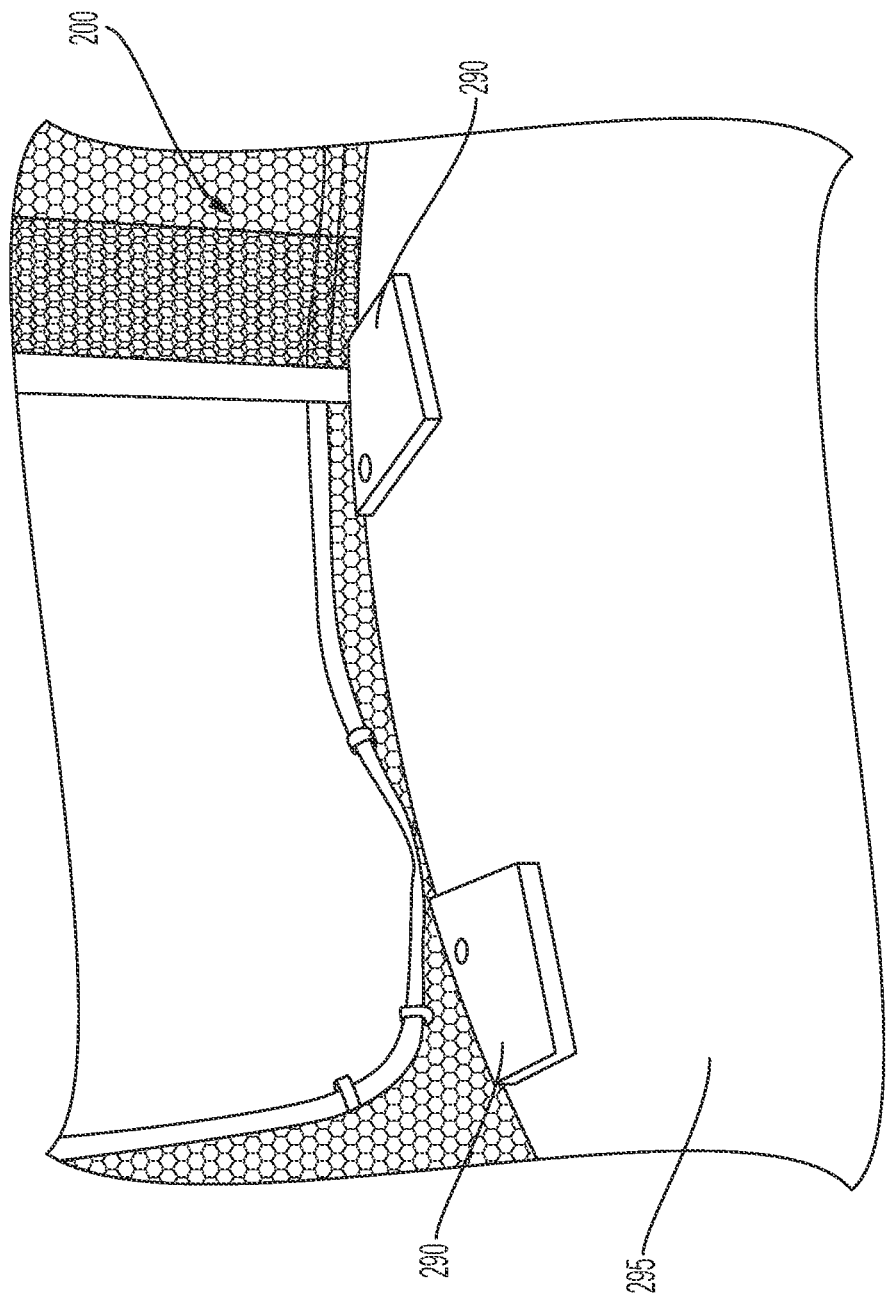
FIG. 8 illustrates a complementary positioning mechanism of the example MRI system of FIG. 2, in accordance with some embodiments of the technology described herein.

In some embodiments, the RF coil apparatus 300 is removably coupled to the MRI system 200 via mechanical components. Accordingly, RF coil apparatus 300 may be inserted and removed from MRI system 200 as desired. For example, FIG. 7 illustrates an example positioning mechanism of the example radio frequency coil apparatus of FIGS. 3A-3C, in accordance with some embodiments of the technology described herein. As shown in FIG. 7, second plate 303B of frame 302 of RF coil apparatus 300 comprises slots 312 for receiving raised portions 290 disposed on an imaging region base 295 of MRI system 200. The inventors have recognized that ensuring the positioning of the RF coil apparatus 300 relative to the MRI system 200 is important to maintain frequency and homogeneity of the magnetic field generated by the coil 304. Thus, slots 312 help ensure that the RF coil apparatus 300 is appropriately positioned relative to MRI system 200 and that RF coil apparatus 300 does not shift in position during imaging. Although FIGS. 7-8 illustrate a particular combination of components for coupling the RF coil apparatus 300 to the MRI system 200, other techniques are possible. For example, in some embodiments, the number and position of the slots and/or the raised portions may vary, among other aspects.

In some embodiments, the RF coil apparatus 300 may be electronically coupled to the MRI system 200. For example, the MRI system 200 may comprise electronics for powering the coil 304, such as an amplifier. In some embodiments, the electronics of the MRI system 200 are housed in a base of the MRI system 200, such as base 250 shown in FIG. 2A. In some embodiments, the MRI system 200 may control operation of the coil 304. For example, the MRI system 200 may be configured to control how the coil 304 transmits RF pulses (e.g., according to a particular pulse sequence), among other aspects.

Alternatives and Scope

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device such as a controller or console of an MRI device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

The above-described embodiments of the technology can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as a controller that controls the above-discussed function. A controller can be implemented in numerous ways, such as with dedicated hardware, or with general purpose hardware (e.g., one or more processor) that is programmed using microcode or software to perform the functions recited above, and may be implemented in a combination of ways when the controller corresponds to multiple components of a system.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding,"

"composed of," and the like are to be understood to be open-ended, i.e., to mean including but not limited to. Only the transitional phrases "consisting of" and "consisting essentially of" shall be closed or semi-closed transitional phrases, respectively.

The invention claimed is:

1. A radio frequency (RF) coil apparatus configured to facilitate imaging a patient positioned within a magnetic resonance imaging (MRI) system, the MRI system comprising a $B_0$ magnet, the radio frequency coil apparatus comprising:
a frame comprising a first plate and a second plate disposed opposite the first plate; and an RF transmit coil comprising a plurality of conductors connected in series, the plurality of conductors being wound around the frame and forming a plurality of turns.

2. The RF coil apparatus of claim 1, wherein the $B_0$ magnet produces a $B_0$ field oriented along a vertical axis and the RF transmit coil is configured to transmit RF pulses perpendicular to the vertical axis.

3. The RF coil apparatus of claim 1, wherein the first and second plates of the frame are parallel to each other.

4. The RF coil apparatus of claim 3, wherein an imaging region of the MRI system is disposed between the first and second plates.

5. The RF coil apparatus of claim 1, wherein each conductor of the plurality of conductors forms a respective one of the plurality of turns of the RF transmit coil.

6. The RF coil apparatus of claim 1, wherein the plurality of turns comprises at least six and no more than 12 turns.

7. The RF coil apparatus of claim 1, wherein the frame comprises a plurality of grooves, and the plurality of conductors are positioned in respective ones of the plurality of grooves.

8. The RF coil apparatus of claim 7, wherein at least one of the plurality of grooves is nonlinear.

9. The RF coil apparatus of claim 8, wherein the at least one of the plurality of grooves comprises one or more peaks and one or more valleys.

10. A magnetic resonance imaging (MRI) system configured to image a patient positioned within the MRI system, the MRI system comprising:
a $B_0$ magnet that produces a $B_0$ magnetic field; and
a radio frequency (RF) coil apparatus comprising:
a frame comprising a first plate and a second plate disposed opposite the first plate; and
an RF transmit coil comprising a plurality of conductors connected in series, the plurality of conductors being wound around the frame and forming a plurality of turns.

11. The MRI system of claim 10, wherein the $B_0$ magnetic field has a strength between 0.05 T and 0.1 T.

12. The MRI system of claim 10, wherein the $B_0$ magnetic field has a strength between 0.1 T and 0.2 T.

13. The MRI system of claim 10, wherein an imaging region of the MRI system is disposed between the first and second plates.

14. The MRI system of claim 10, wherein the RF transmit coil is electrically coupled to the MRI system.

15. The MRI system of claim 10, wherein the frame is configured to be mechanically coupled to the MRI system.

16. The MRI system of claim 15, wherein the MRI system comprises one or more raised portions and the frame comprises one or more slots for receiving the one or more raised portions of the MRI system.

17. The MRI system of claim 10, wherein the $B_0$ magnet comprises first and second $B_0$ magnets arranged relative to one another so that an imaging region is provided therebetween, and the RF coil apparatus is disposed between the first and second $B_0$ magnets.

18. The MRI system of claim 17, further comprising first and second sets of gradient coils disposed between the first and second $B_0$ magnets, and wherein the RF coil apparatus is disposed between the first and second sets of gradient coils.

19. A magnetic resonance imaging (MRI) system configured to image a patient positioned within the MRI system, the MRI system comprising:
a $B_0$ magnet that produces a $B_0$ magnetic field;
a first radio frequency (RF) coil apparatus comprising:
a frame; and
an RF transmit coil comprising a plurality of conductors wound around the frame and forming a plurality of turns; and
a second RF coil apparatus comprising:
at least one RF receive coil configured to detect MR signals produced within the $B_0$ magnetic field.

20. The MRI system of claim 19, wherein the second RF coil apparatus is disposed between the first and second plates of the first RF coil apparatus.

* * * * *